(12) United States Patent
Zhang et al.

(10) Patent No.: US 8,453,321 B2
(45) Date of Patent: *Jun. 4, 2013

(54) METHOD FOR MANUFACTURING MULTILAYER FLEXIBLE PRINTED CIRCUIT BOARD

(75) Inventors: Jun-Qing Zhang, Shenzhen (CN); Chih-Yi Tu, Taoyuan (TW); Szu-Min Huang, Taoyuan (TW)

(73) Assignees: FuKui Precision Component (Shenzhen) Co., Ltd., Shenzhen (CN); Zhen Ding Technology Co., Ltd., Tayuan, Taoyuan (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/164,776

(22) Filed: Jun. 21, 2011

(65) Prior Publication Data
US 2011/0247207 A1    Oct. 13, 2011

Related U.S. Application Data

(62) Division of application No. 11/957,324, filed on Dec. 14, 2007, now Pat. No. 8,042,265.

(30) Foreign Application Priority Data

Apr. 13, 2007  (CN) ........................ 2007 1 0074023

(51) Int. Cl.
*H05K 3/46* (2006.01)
(52) U.S. Cl.
USPC ............. 29/830; 29/847; 156/306.6; 174/254
(58) Field of Classification Search
USPC ........... 29/830, 846, 847; 174/254; 156/306.6
See application file for complete search history.

(56) References Cited

U.S. PATENT DOCUMENTS 4,258,468 A * 3/1981 Balde .............................. 29/830
5,178,318 A * 1/1993 Edwin et al. ............. 228/180.22

* cited by examiner

*Primary Examiner* — Livius R Cazan
(74) *Attorney, Agent, or Firm* — Altis Law Group, Inc.

(57) ABSTRACT

A method for manufacturing a multilayer FPCB which includes providing a first substrate, a second substrate and a binder layer; defining an opening on the binder layer; defining a first slit in the dielectric layer of the first substrate; laminating the first substrate, the binder layer and the second substrate; forming a second slit in the conductive layer of the first substrate, the second slit being created so as to align with the first slit, cutting the first substrate, the binder layer and the second substrate thereby forming a multilayer flexible printed circuit board having different numbers of layers in different areas.

15 Claims, 34 Drawing Sheets

METHOD FOR MANUFACTURING MULTILAYER FLEXIBLE PRINTED CIRCUIT BOARD

CROSS-REFERENCE TO RELATED APPLICATION

This patent application is a divisional application of U.S. patent application Ser. No. 11/957,324 filed on Dec. 14, 2007, entitled "METHOD FOR MANUFACTURING MULTILAYER FLEXIBLE PRINTED CIRCUIT BOARD," now U.S. Pat. No. 8,042,265, assigned to the same assignee, and disclosure of which is incorporated herein by reference in its entirety.

BACKGROUND

1. Technical Field

The present invention relates to a method for manufacturing a flexible printed circuit board, and particularly to a method for manufacturing a multilayer flexible printed circuit board having different thicknesses in different areas.

2. Discussion of Related Art

Flexible printed circuit boards (FPCB) have been widely used in electronic products such as mobile phones, printing heads and hard disks. In these electronic products, some parts may move relative to a main body. In such a situation, FPCBs are applied to provide electrical connections and transmit signals between such parts and the main body due to their flexibility.

FIG. 34 shows a multilayer FPCB structure, which has different numbers of layers in different areas. In other words, there are thick areas and thin areas within the same FPCB. The thick area can have a higher circuit density, whilst the thin area exhibits higher flexibility.

FIGS. 29-34 show a process for manufacturing such a type of FPCB. As shown in FIGS. 29 and 30, a first copper clad laminate (CCL) 41, a binder layer 45 and a second CCL 42 are laminated. As is shown in FIG. 31, dry films 412, 422 are respectively applied on the first CCL 41 and the second CCL 42, and then, the dry films 412, 422 are exposed and developed. Because there is a cliff-like thickness difference between the first CCL 41 and the second CCL 42, a gap 46 is formed in the included angle at the base of the 'cliff'.

As shown in FIG. 32, during an etching process, when the first CCL 41 and the second CCL 42 are immersed in an etching solution, the solution can seep into the gap 46 and react with the dielectric layers of the first CCL 41 and/or the second CCL 42. As a result, the dielectric layers may become unstable and peel from the first CCL 41 and/or the second CCL 42.

Referring to FIG. 33, a third CCL 43 and a fourth CCL 44 are respectively laminated with the first CCL 41 and the second CCL 42, to make another multilayer FPCB. Referring to FIG. 34, in order to electrically connect the copper layers of the third CCL 43, the first CCL 41, the second CCL 42, and the fourth CCL 44, a via hole 47 is defined so as to penetrate all the four CCLs. The via hole 47 can be made by drilling or by laser ablation. After the via hole 47 is formed, a conductive layer, e.g., a copper layer, is formed on a sidewall of the via hole 47 by electroless plating or electroplating. In the plating process, the dielectric layer of the second CCL 42 is exposed in a plating solution, thereby forming a number of copper lumps 48 thereon. These copper lumps 48 can pierce dry film that is applied onto the second CCL 42 in the next pattern-forming process, and the etching solution used for developing the dry film can react with dielectric layer or copper layer of second CCL 42 and result in a poor quality product.

In the aforementioned process for manufacturing multilayer FPCB that has different number of layers in different areas, a step structure between different CCLs can causes a series of quality problems. Therefore, a new process for manufacturing multilayer FPCB is desired to overcome the aforementioned quality problems.

BRIEF DESCRIPTION OF THE DRAWINGS

Many aspects of the present method can be better understood with reference to the following drawings. The components in the drawings are not necessarily drawn to scale, the emphasis instead being placed upon clearly illustrating the principles of the present method.

DETAILED DESCRIPTION

FIGS. 1-10 show the successive stages of a process for manufacturing an FPCB that has a different number of layers in different areas, in accordance with a first embodiment.

Figure 1:
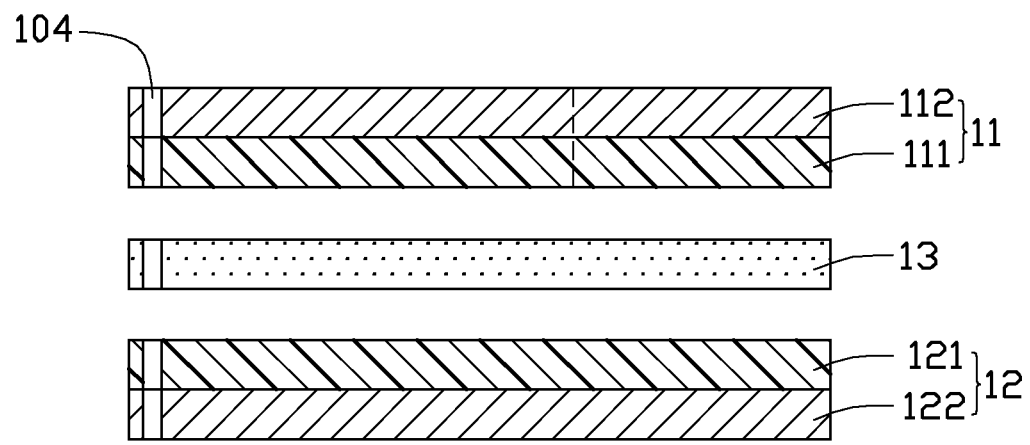
FIGS. 1 to 10 are schematic views, showing a process for manufacturing a multilayer FPCB having a different number of layers in different areas, in accordance with a first embodiment.

Referring to FIG. 1, a first substrate 11 includes a dielectric layer 111 and a conductive layer 112 formed on the dielectric layer 111. The second substrate 12 includes a dielectric layer 121 and a conductive layer 122 formed on the dielectric layer 121. A binder layer 13 is sandwiched between the first substrate 11 and the second substrate 12. A locating hole 104 is defined so as to penetrate through the first substrate 11, the binder layer 13 and the second substrate 12.

Figure 2:
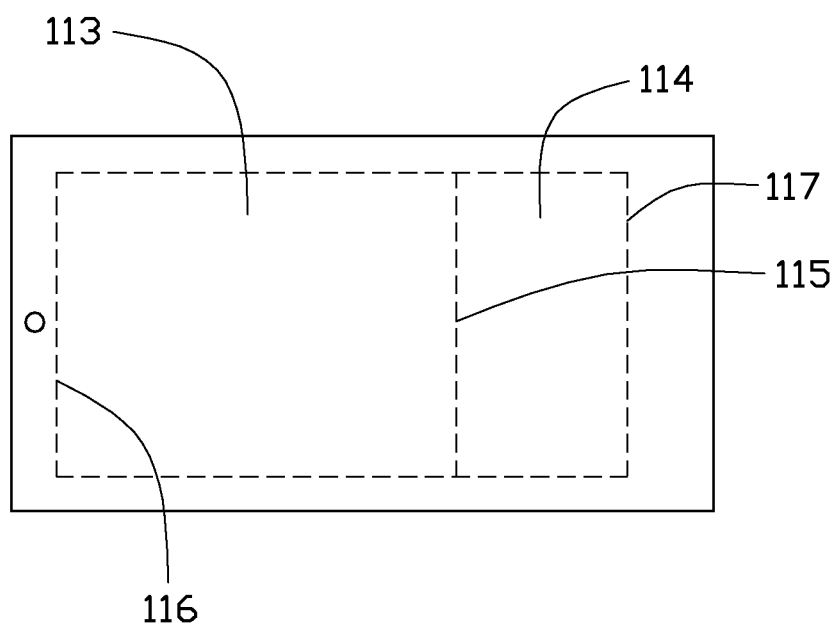

Referring to FIG. 2, the first substrate 11 includes a main portion 113 surrounded by an imaginary boundary line 116 (i.e. a functional portion prepared for making a circuit thereon according to need) and an excess portion 114 surrounded by an imaginary boundary line 117 (i.e. a sacrificing portion which will be removed in a later step). An imaginary boundary line 115 is defined between the main portion 113 and the excess portion 114. The main portion 113 is encompassed by an imaginary boundary line 116 and the imaginary boundary line 115. The excess portion 114 is encompassed by another imaginary boundary line 117 and the imaginary boundary line 115.

Materials of the dielectric layers 111, 121 and the binder layer 13 can be selected from the group consisting of polyimide, polytetrafluoroethylene, polythiamine, polymethacrylic acid, polycarbonate, polycarbonate ester, polyester, copolymer of imide, ethylene and dimethyl terephthalate. The conductive layers 112, 122 can be a film made of copper, silver or aluminum.

Figure 3:
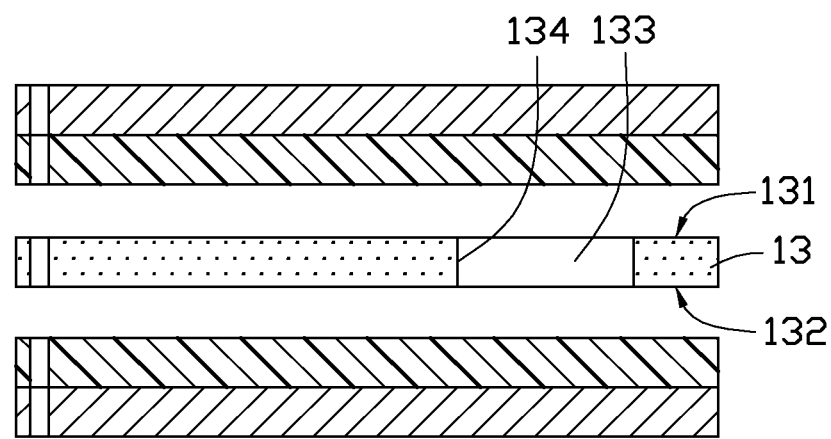
Figure 4:
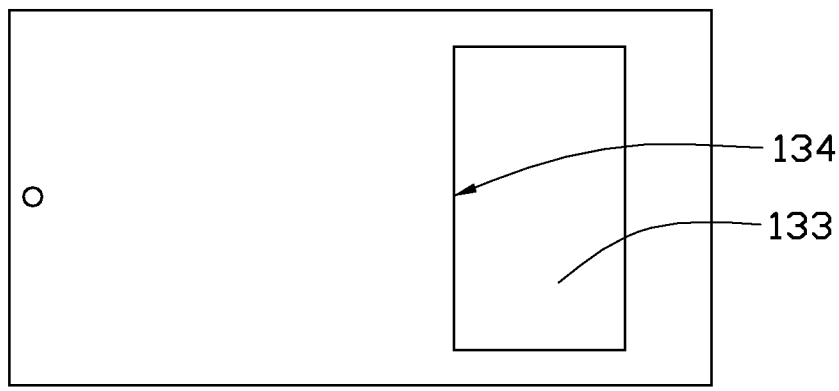

Referring to FIGS. 3 and 4, the binder layer 13 includes two opposite surfaces 131, 132. An opening 133 is formed in the binder layer 13 thereby an inner side wall surface 134 of the binder layer 13 is defined. The opening 133 can be formed by cutting, stamping, laser ablation or etching. In this embodiment, the opening 133 has a rectangular shape, but the opening 133 can also be of other shapes, for example, trapezium, triangle etc.

Figure 5:
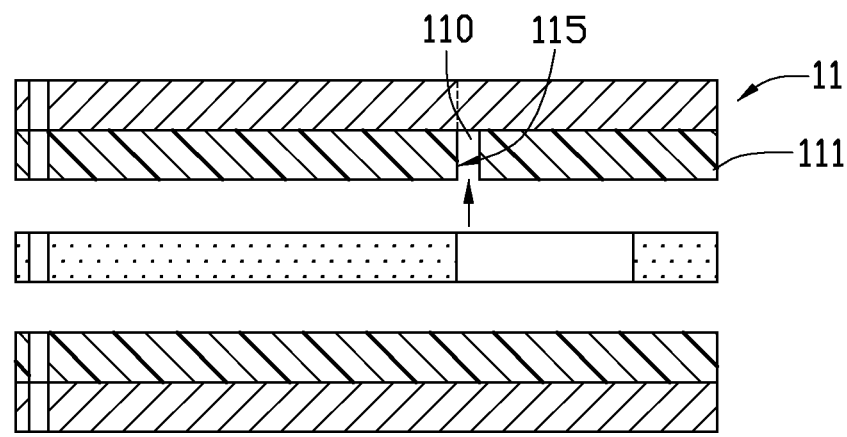

Referring to FIG. 5, a first slit 110 is formed in the dielectric layer 111 of the first substrate 11 along the boundary line 115. The first slit 110 can be formed by laser ablation or etching. E-beam etching or plasma etching can also be used to form the first slit 110.

Figure 6:
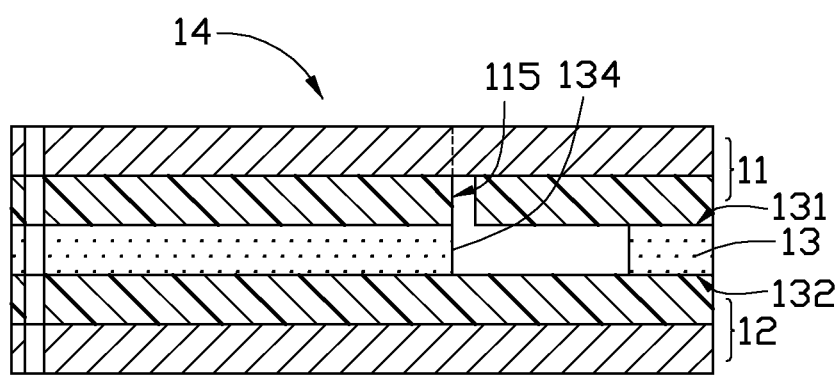

Referring to FIG. 6, the first substrate 11 and the second substrate 12 are respectively laminated on the two opposite surfaces 131, 132 of the binder layer 13, thereby a semi-finished FPCB 14 is obtained. The excess portion 114 is exposed to and suspended above the opening 133. The boundary line 115 is aligned with the inner side wall surface 134 of the binder layer 13.

Figure 7:
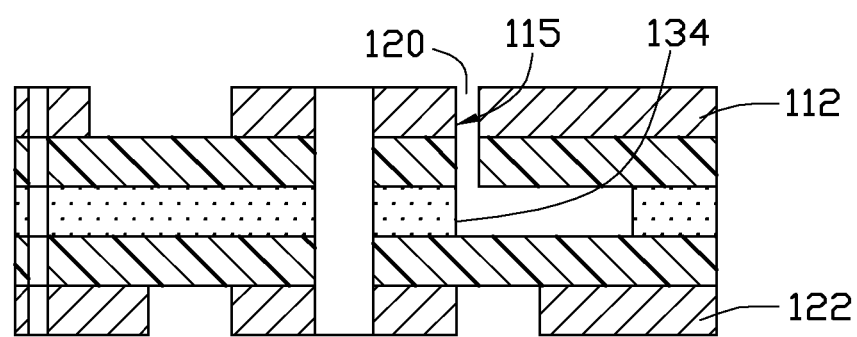

Referring to FIG. 7, conductive patterns are formed in the conductive layers 112, 122. In this embodiment, the conductive patterns are formed using a DES (Developing, Etching and Stripping) process. Alternatively, the conductive patterns can also be formed using laser. A second slit 120 is formed in the conductive layer 112 along the boundary line 115. The second slit 120 can be formed with the conductive patterns in the conductive layer 112 simultaneously, that is, the second slit 120 is a portion of the conductive patterns in the conductive layer 112. Alternatively, the second silt 120 can also be formed after the making of the conductive patterns in the conductive layer 112. For example, the second slit 120 can be formed using laser ablation after the conductive patterns is formed.

Figure 8:
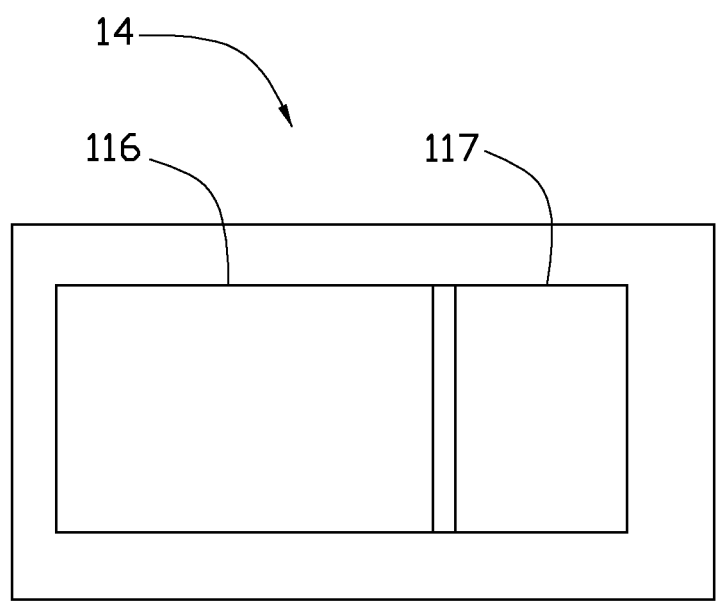
Figure 9:
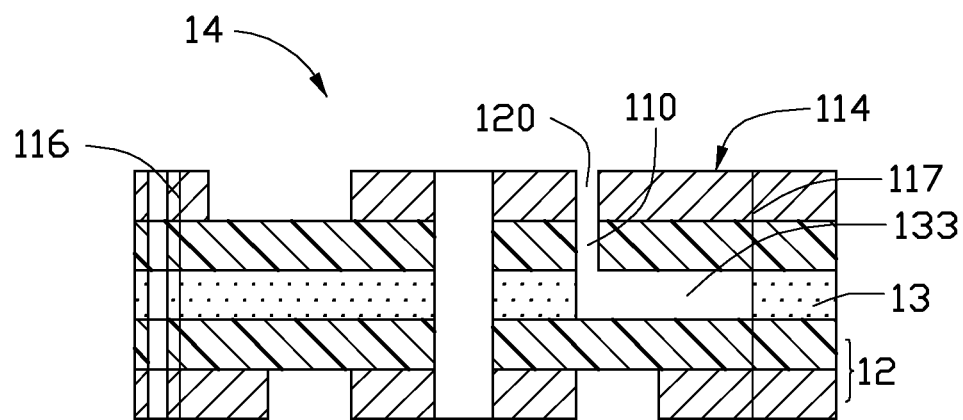

Referring to FIGS. 8 and 9, the semi-finished FPCB 14 is cut along the boundary 116 and 117. The excess portion 114 is not conglutinated with the binder layer 13 and is therefore very easy to remove. In this embodiment, the semi-finished FPCB 14 is cut using a stamper, and the excess portion 114 can be removed together with the stamper.

Figure 10:
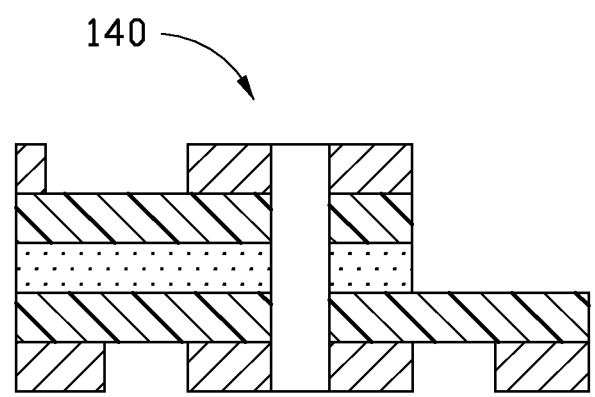

Referring to FIG. 10, a FPCB 140 with a different number of layers in different areas is obtained.

FIGS. 11-17 show the successive stages of a process for manufacturing an FPCB that has a different number of layers in different areas, in accordance with a second embodiment.

Figure 11:
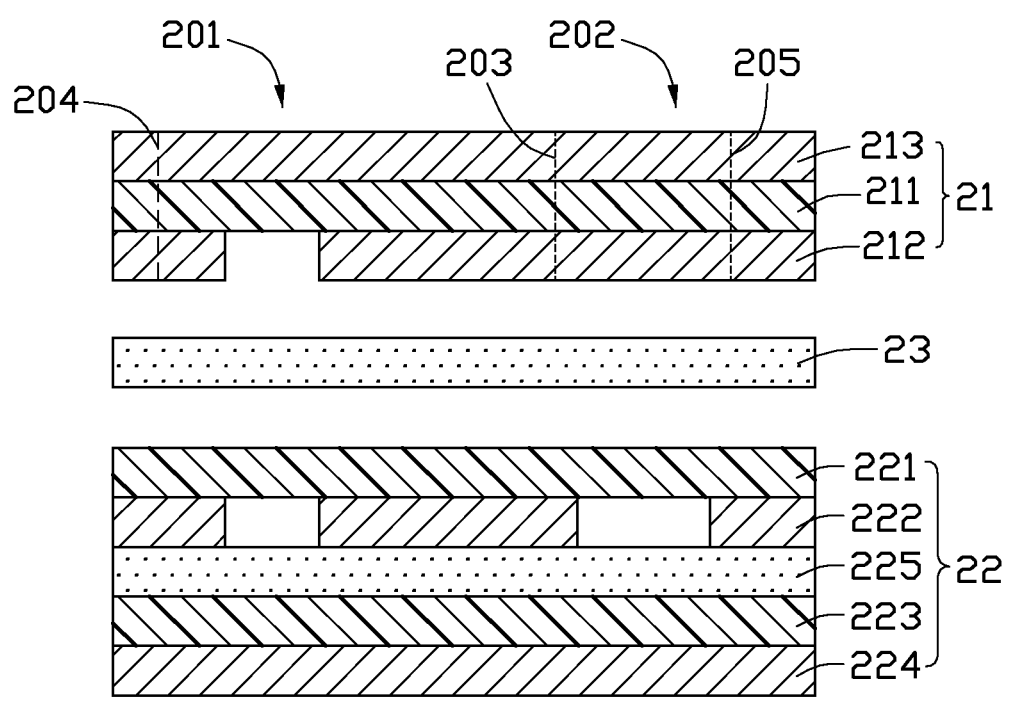
FIGS. 11 to 28 are schematic views, showing a process for manufacturing a multilayer FPCB having a different number of layers in different areas, in accordance with the second embodiment.

Referring to FIG. 11, a first substrate 21 includes a dielectric layer 211, a conductive layer 212 and an outer conductive layer 213. The conductive layer 212 and the outer conductive layer 213 are respectively formed on two opposite surfaces of the dielectric layer 211. The conductive layer 212 has conductive patterns formed therein, i.e., the conductive layer 212 is made into a conductive pattern. The first substrate 21 includes a main portion 201 (i.e. a remaining portion which is designed in a particular fashion) and an excess portion 202 (i.e. a sacrificing portion which will be removed in a later step). A boundary 203 is sandwiched between the main portion 201 and the excess portion 202. The main portion 201 has a boundary 204. The excess portion has a boundary 205.

The second substrate 22 includes two dielectric layers 221 and 223, two conductive layers 222 and 224, and a binder layer 225. The conductive layer 222 is formed on the dielectric layer 221. The conductive layer 224 is formed on the dielectric layer 223. The binder layer 225 is in contact with the conductive layer 222 and the dielectric layer 223.

Figure 12:
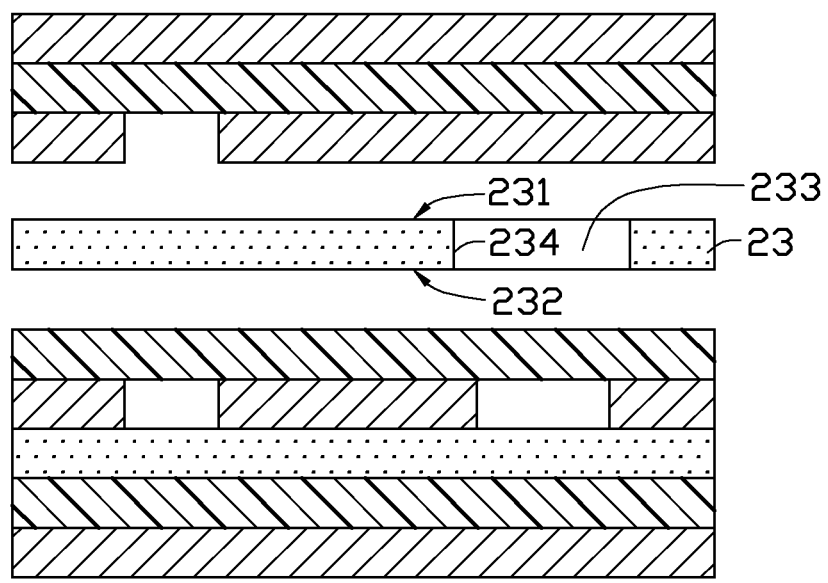

Referring to FIG. 12, the binder layer 23 includes two opposite surfaces 231 and 232. An opening 233 is formed in the binder layer 23 in such a way that an inner sidewall surface 234 of the binder layer 23 is formed. The opening 233 can be formed by cutting, stamping, laser ablation or etching. In this preferred embodiment, the opening 233 has a rectangular shape, but the opening 233 can also be of other shapes, for example, trapezium, triangle etc.

Figure 13:
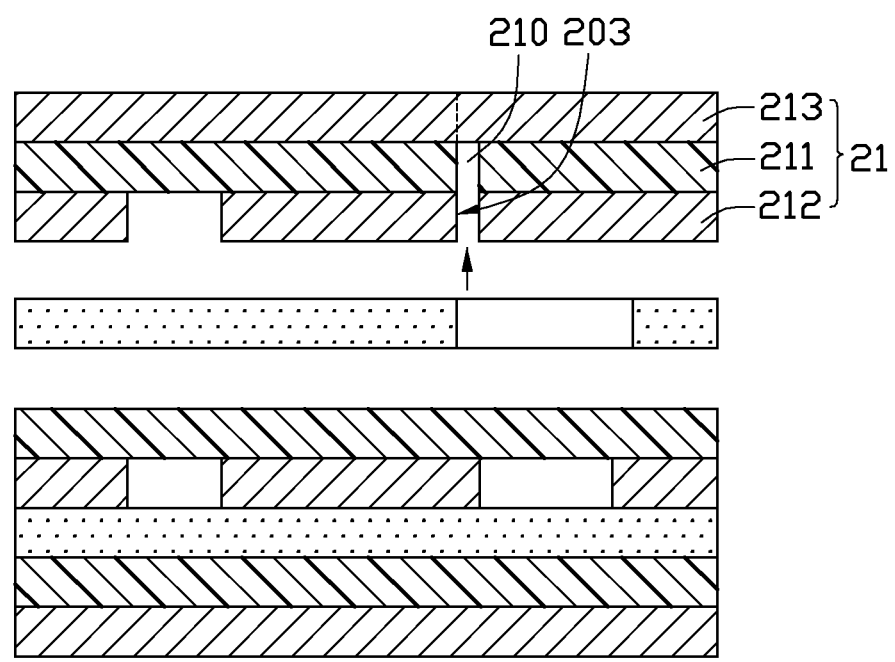

Referring to FIG. 13, a first slit 210 is formed in the dielectric layer 211 and the conductive layer 212 along the boundary 203, that is, the first slit 210 is formed in all the layers in the first substrate 21 except the outer conductive layer 213.

Figure 14:
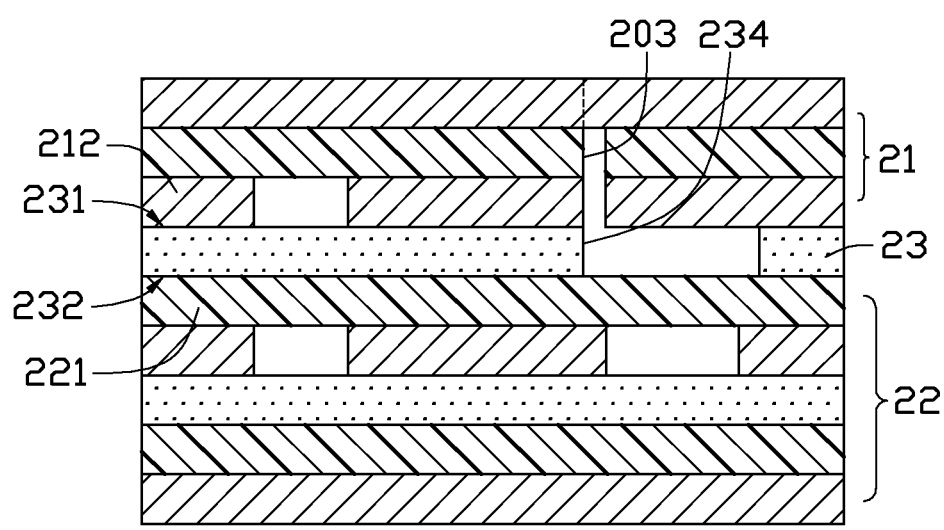

Referring to FIG. 14, the first substrate 21 and the second substrate 22 are respectively laminated on two opposite surfaces 231 and 232 of the binder layer 23. The conductive layer 212 is in contact with the surface 231. The dielectric layer 221 is in contact with the surface 232. The boundary 203 is aligned with the inner sidewall surface 234. The excess portion 202 of the first substrate 21 is exposed to and suspended above the opening 233.

Figure 15:
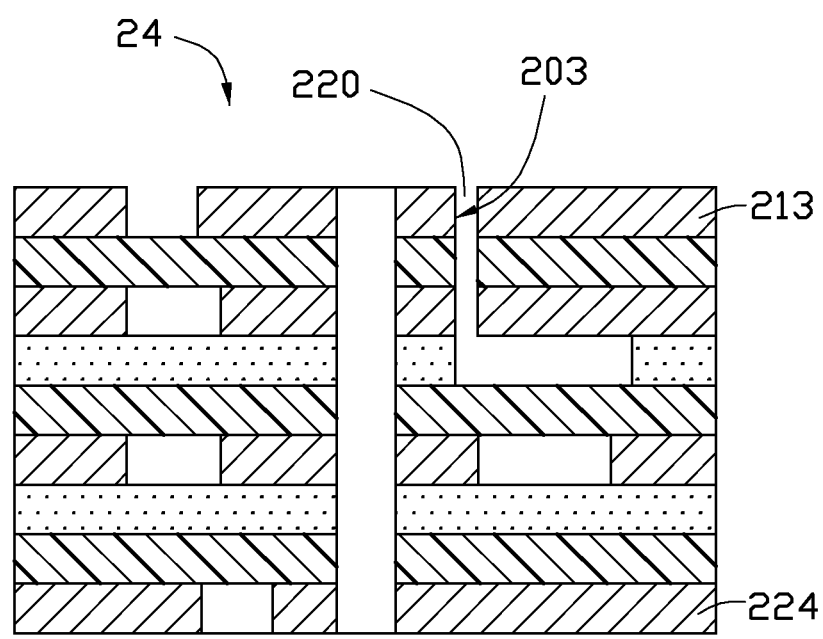

Referring to FIG. 15, conductive patterns are formed in the outer conductive layer 213 and the conductive layer 224, thereby a semi-finished FPCB 24 is obtained. A second slit 220 is also formed in the outer conductive layer 213 along the boundary 203. In this embodiment, the conductive patterns and the second slit are formed at a same time using a DES process.

Figure 16:
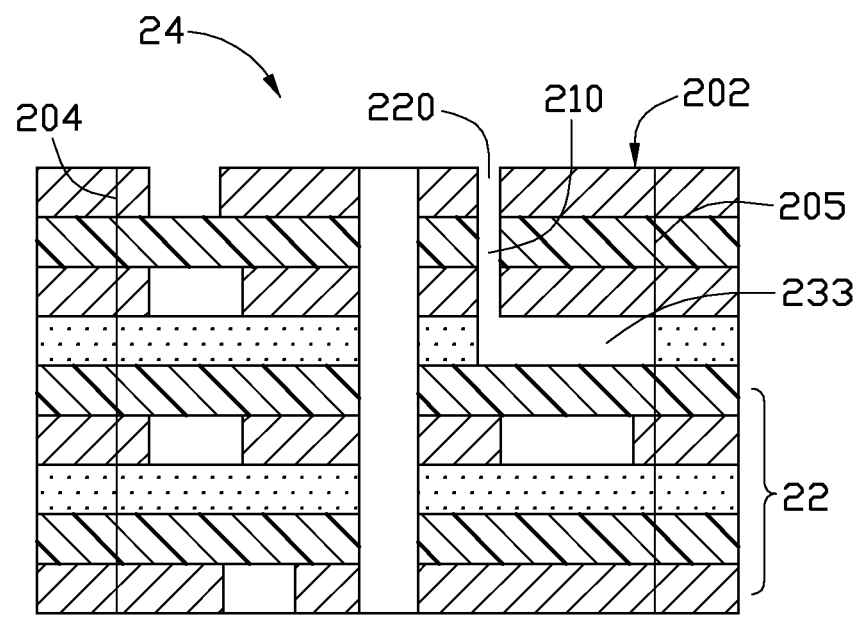
Figure 17:
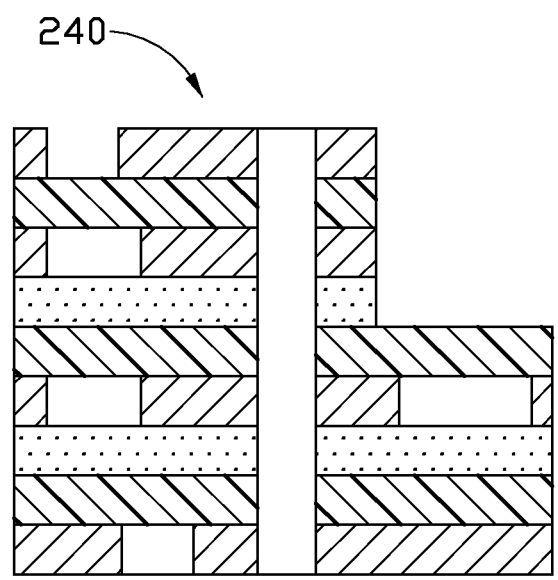

Referring to FIGS. 16 and 17, the semi-finished FPCB 24 is cut along the boundary 204 and 205 so as to remove the excess portion 202, thereby a FPCB 240 with a different number of layers in different areas is obtained.

FIGS. 18-26 show the successive stages of a process for manufacturing an FPCB that has different number of layers in different areas, in accordance with a third preferred embodiment.

Figure 18:
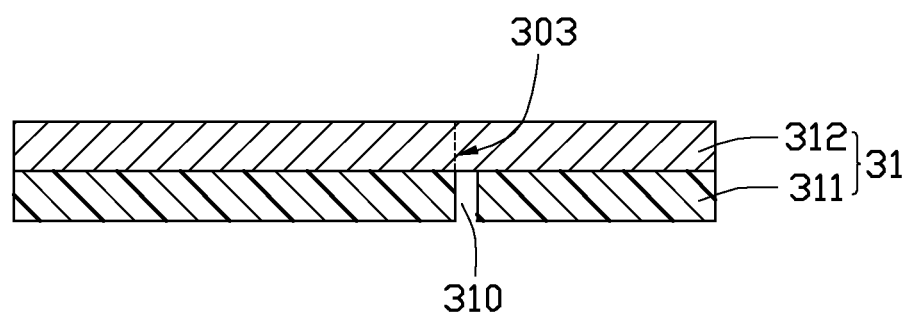
Figure 19:
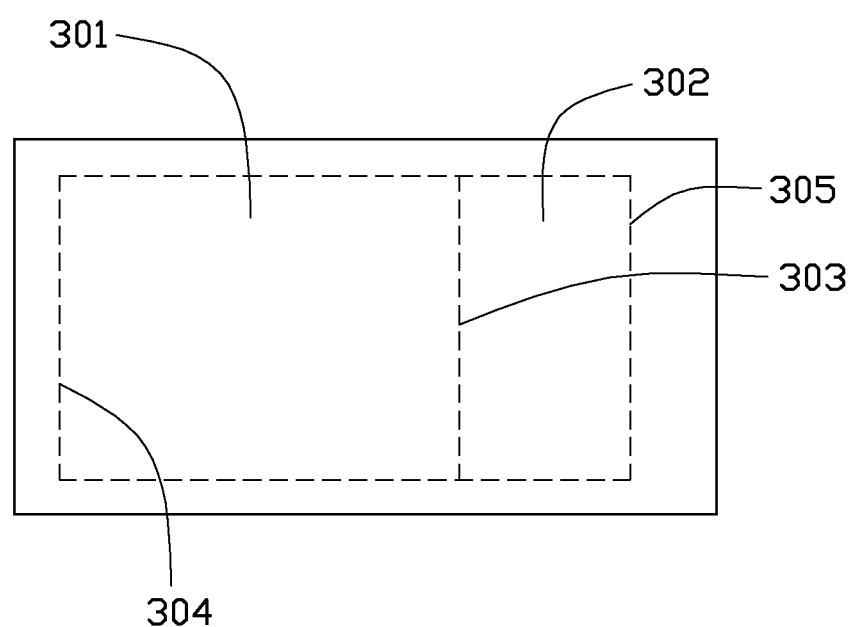

Referring to FIG. 18, the first substrate 31 includes a dielectric layer 311 and a conductive layer 312 formed on the dielectric layer 311. Referring to FIG. 19, the first substrate 31 includes a main portion 301 and an excess portion 302. The main portion 31 has a boundary 304. The excess portion 302 has a boundary 305. A boundary 303 is provided between the main portion 301 and the excess portion 302. A first slit 310 is formed in the first substrate 31 along the boundary 303.

Figure 20:
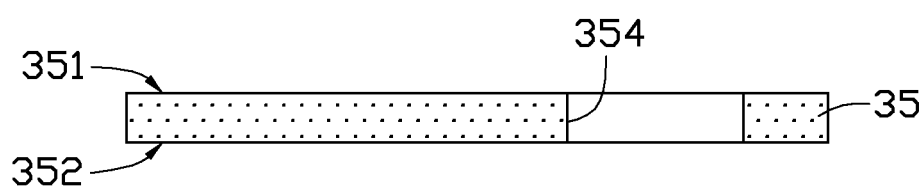
Figure 21:
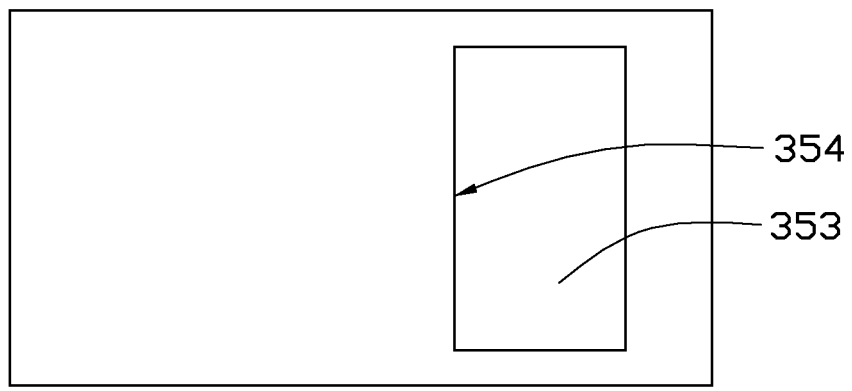

Referring to FIGS. 20 and 21, an inner binder layer 35 has two opposite surfaces 351, 352. An opening 353 is formed in the inner binder layer 35, thereby an inner sidewall surface 354 is formed in the inner binder layer 35.

Figure 22:
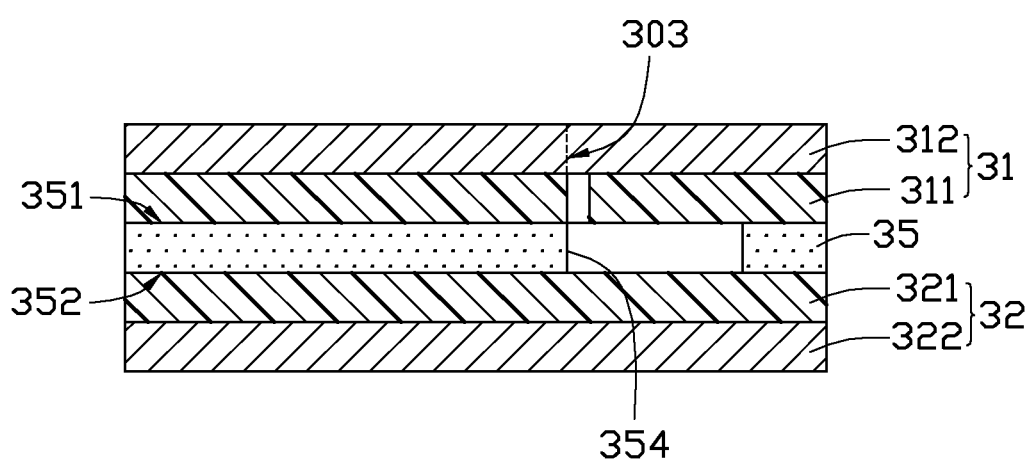

Referring to FIG. 22, a first substrate 31 and a second substrate 32 are respectively laminated on two opposite surfaces 351, 352. The second substrate 32 includes a dielectric layer 321 and a conductive layer 322 formed on the dielectric layer 321. The dielectric layer 311 contacts the surface 351. The dielectric layer 321 contacts the surface 352. The boundary 303 is aligned with the inner sidewall surface 354.

Figure 23:
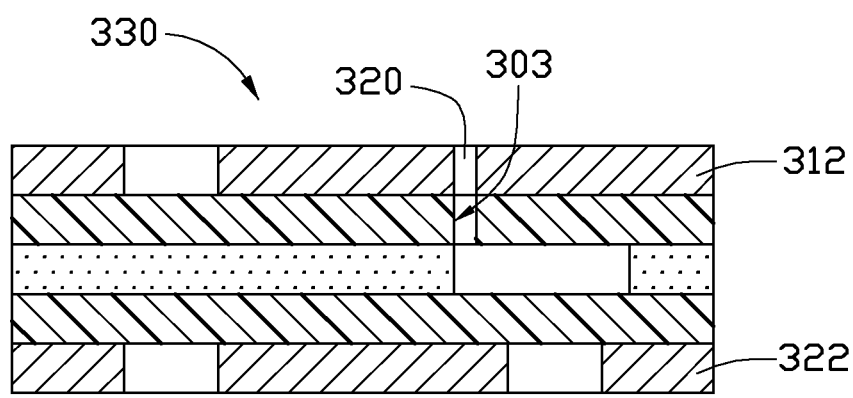

Referring to FIG. 23, conductive patterns are formed in the conductive layer 312 and 322 thereby an inner laminated structure 330 is obtained. A second slit 320 is formed in the conductive layer 312 along the boundary 303. In the present embodiment, the conductive patterns are formed using a DES process. The second slit 320 is formed at a same time with conductive patterns.

Figure 24:
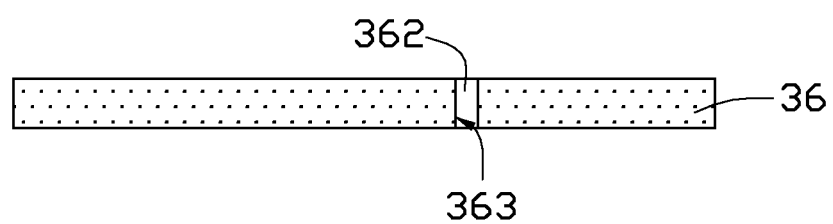
Figure 25:
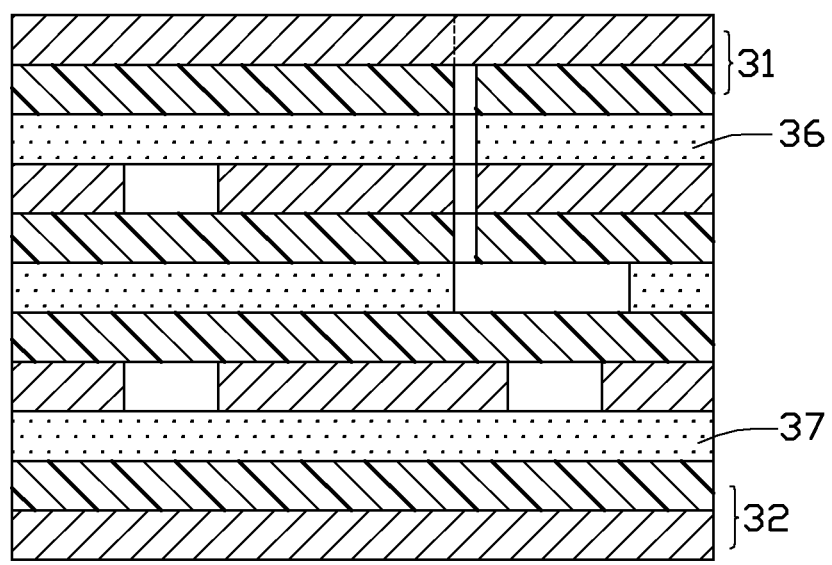

Referring to FIG. 24, a first outer binder layer 36 includes a third slit 362 formed therein, in such a way that an inner sidewall surface 363 is formed in the first outer binder layer 36. Referring to FIG. 25, the first outer binder layer 36 is applied on the conductive layer 312, an second outer binder layer 37 is applied on the conductive layer 322. Another first substrate 31 is applied on the first outer binder layer 36 and another second substrate 32 is applied on the second outer binder layer 37. Then, the first substrate 31, the first outer binder layer 36, the inner laminated structure 330, the second outer binder layer 37 and the second substrate 32 are laminated using a laminating machine. The dielectric layer 311 is in contact with the first outer binder layer 36. The dielectric layer 321 is in contact with the second outer binder layer 37.

Figure 26:
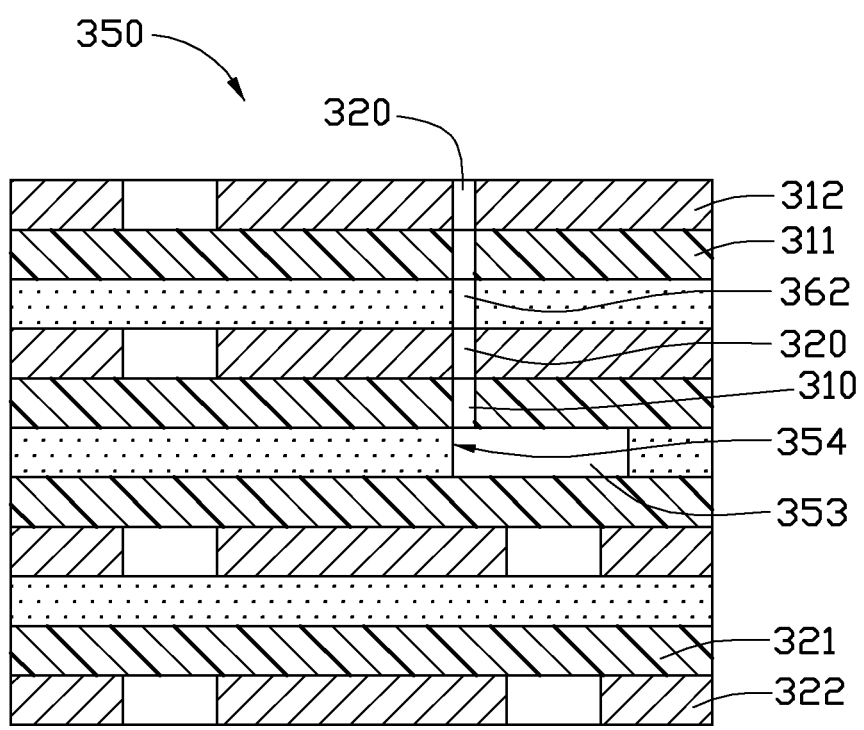

Referring to FIG. 26, conductive patterns are formed in the conductive layer 312 and 322 thus a semi-finished FPCB 350 is obtained. A second slit 320 is formed in the conductive layer 312. In this embodiment, the second slit 320 is formed together with the conductive patterns. The two first slits 310, the two second slits 320 and the third slit 362 are configured to be aligned and in communication with the opening 353.

Figure 27:
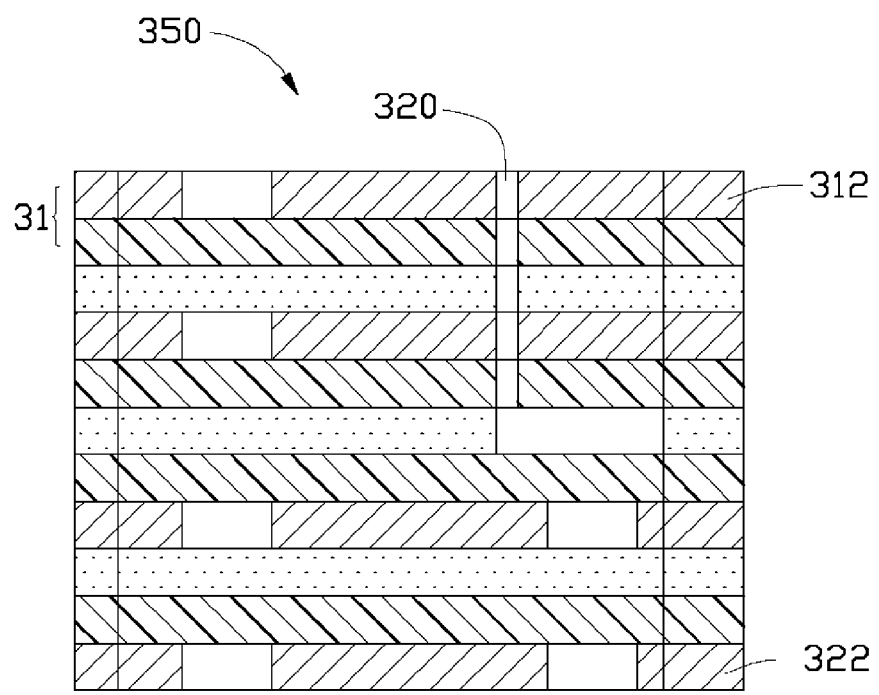
Figure 28:
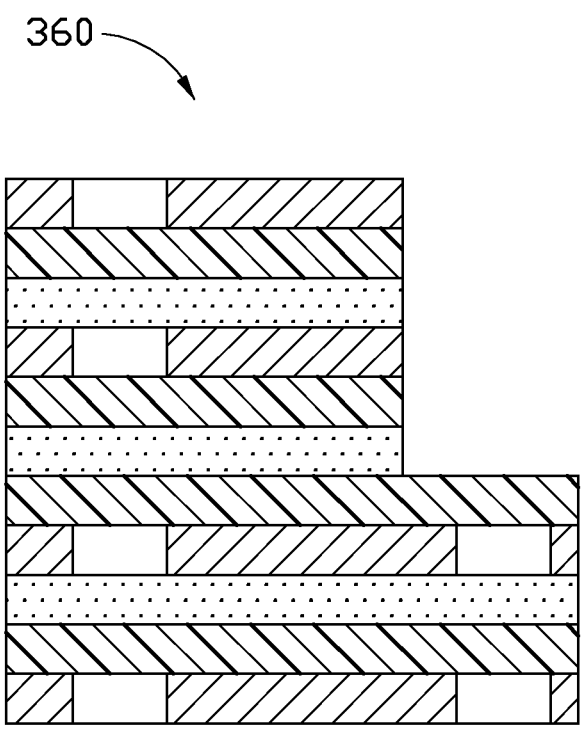
Figure 29:
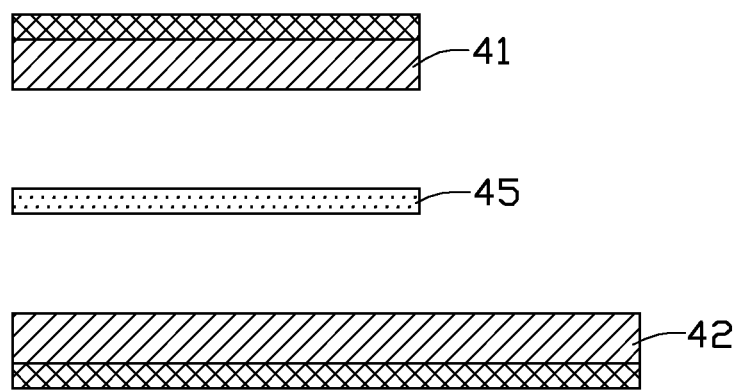
FIGS. 29 to 34 are schematic views, showing a process for manufacturing a multilayer FPCB having a different number of layers in different areas, in accordance with the third embodiment.
Figure 30:
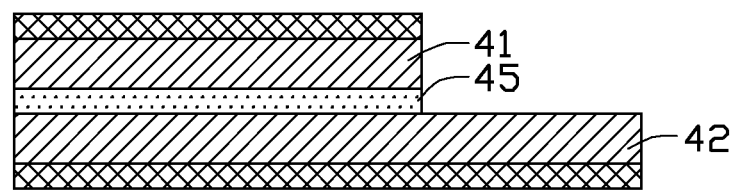
Figure 31:
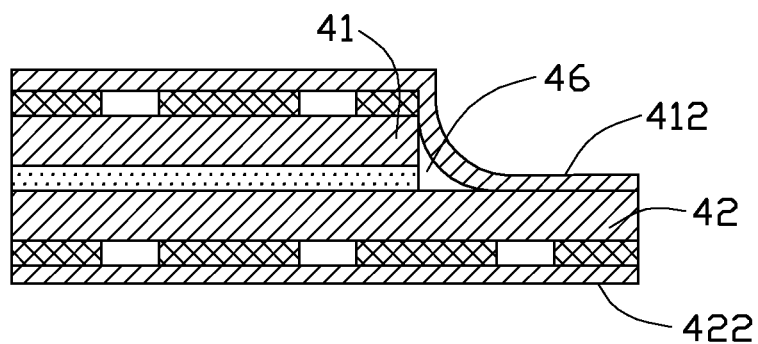
Figure 32:
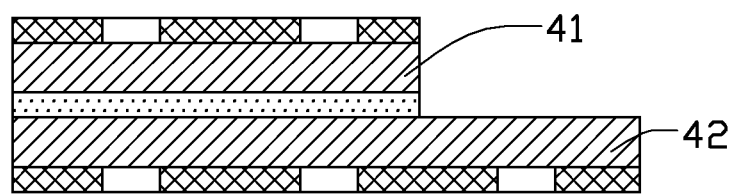
Figure 33:
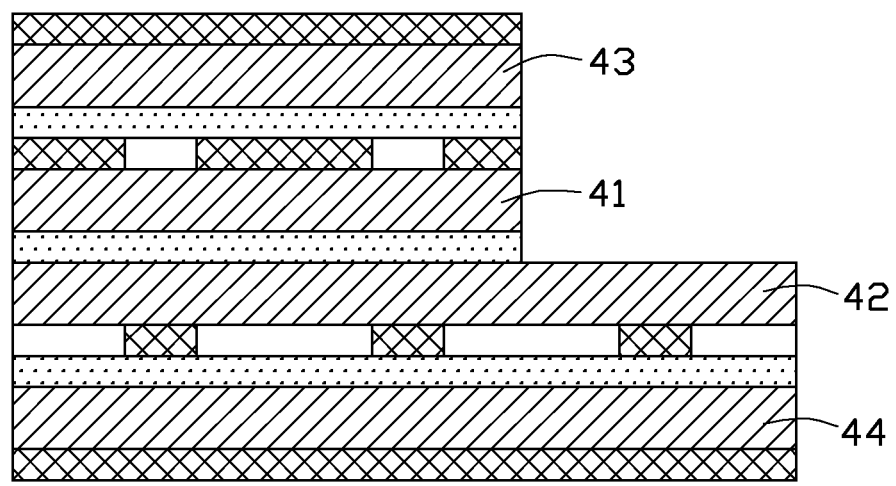
Figure 34:
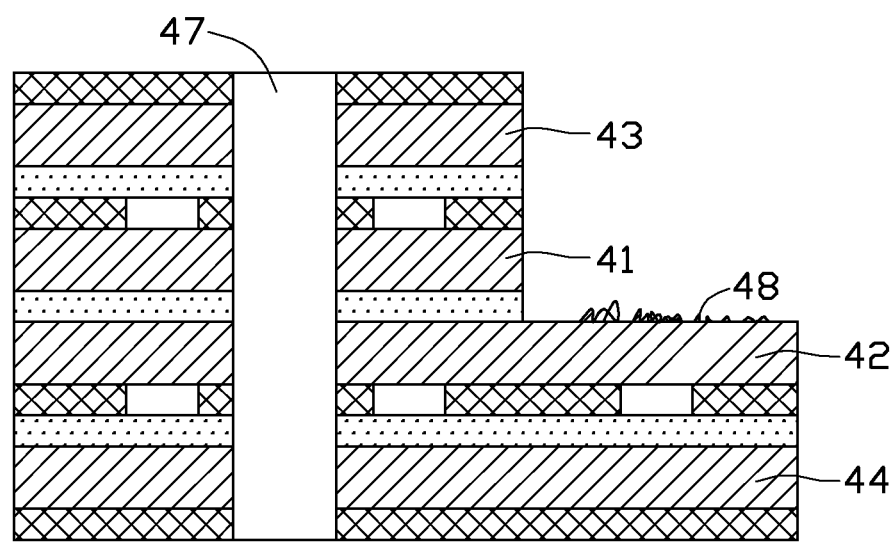

Referring to FIG. 27, the semi-finished FPCB 350 is cut along the boundary of the main portion 301 and the excess portion 302 of the first substrate 31, so as to remove the excess portion 302 of the first substrate 31. Referring to FIG. 28, all the excess portion 302 of the first substrate 31 is removed, thereby a FPCB 360 with different number of layers in different areas is obtained.

In this embodiment, FPCBs are manufactured with the first substrate 31 and the second substrate 32. The inner binder layer 35 separates the FPCB 360 into a first side and a second side. Two first substrates 31 and corresponding binder outer layer 36 constitute the first side. Two second substrate 32 and corresponding second outer binder layer 37 constitute the second side. Because the first substrate 31 has a first slit 310 preformed in the dielectric layer, thus when a second slit 320 aligned with the first slit 310 is formed in the conductive layer 312 of the first substrate 31, the first substrate 31 is cut off at the first slit 310. Furthermore, a third slit 362 aligned with first slit 310 is preformed in the first outer binder layer 36. As a result, after the FPCB 360 is cut along the boundaries of the main portion 301 and the excess portion 302 of the first substrate 31, the excess portion 302 exposed to the opening 353 of the inner binder layer 35 can be easily removed. Thus, a FPCB 360 with a different number of layers in different areas is obtained. In the present embodiment, the FPCB 360 is a four-layer structure. However, more first substrates 31 can be built up on the first side, until the predetermined number of layers is obtained.

In all of these preferred embodiments of manufacturing a FPCB has a different number of layers in different areas, there is no cliff-like structure created in the process, therefore all the aforementioned disadvantages are overcome.

Finally, it is to be understood that the above-described embodiments are intended to illustrate rather than to limit the invention. Variations may be made to the embodiments without departing from the spirit of the invention as claimed. The above-described embodiments illustrate the scope of the invention but do not restrict the scope of the invention.

What is claimed is:

1. A method for manufacturing a multilayer flexible printed circuit board, the method comprising steps of:
   providing a first substrate, the first substrate including a dielectric layer and a conductive layer formed on the dielectric layer, the first substrate having a main portion and an excess portion;
   defining a first slit in the dielectric layer of the first substrate from a surface of the dielectric layer facing away from the conductive layer to an opposite surface thereof along a partition line between the main portion and the excess portion;
   providing a binder layer;
   defining an opening in the binder layer;
   providing a second substrate;
   laminating the first substrate and the second substrate on opposite surfaces of the binder layer in a manner such that a majority of the excess portion of the first substrate is exposed to and suspended above the opening of the binder layer thereby obtaining a semi-finished FPCB;
   forming a conductive pattern in the conductive layer of the first substrate after laminating the first substrate and the second substrate on the binder layer;
   defining a second slit in the conductive layer of the first substrate from a surface of the conductive layer away from the dielectric layer to an opposite surface thereof along the partition line between the main portion and the excess portion after forming the conductive pattern in the conductive layer; and
   cutting the semi-finished FPCB along a peripheral boundary line of the excess portion so as to remove the excess portion of the first substrate, thus a portion of the second substrate being exposed to an exterior through the opening of the binder layer.

2. The method of claim 1, further comprising a step of defining a locating hole in the first substrate, the binder layer and the second substrate.

3. The method of claim 1, wherein the first slit is formed using at least one laser.

4. The method of claim 3, wherein the laser is a carbon oxide laser.

5. The method of claim 3, wherein the at least one laser includes a first laser and a second laser, and the first slit is formed using the first laser and the second laser alternately.

6. The method of claim 1, wherein the second slit is formed using a laser.

7. The method of claim 6, wherein the laser is a Nd:YAG laser.

8. The method of claim 1, wherein the semi-finished FPCB is cut using a stamper or a laser.

9. A method for manufacturing a multilayer flexible printed circuit board, the method comprising steps of:
   providing a first substrate, the first substrate including a dielectric layer and a conductive layer formed on the dielectric layer, the first substrate having a main portion and an excess portion, defining a first slit in the dielectric layer of the first substrate from a surface of the dielectric layer facing away from the conductive layer to an opposite surface thereof along a partition line between the main portion and the excess portion;
   providing an inner binder layer, defining an opening in the inner binder layer;
   providing a second substrate;
   laminating the first and second substrates to the inner binder layer to form an inner laminated structure, the inner binder layer sandwiched between the first and second substrates;
   forming a conductive pattern in the conductive layer of the first substrate after laminating the first and second substrates to the inner binder layer;
   defining a second slit in the conductive layer of the first substrate from a surface of the conductor layer away from the dielectric layer to an opposite surface thereof along the partition line between the main portion and the excess portion after forming the conductive pattern in the conductive layer;
   providing another first substrate defining another first slit in the dielectric layer of said another first substrate along a partition line between the main portion and the excess portion;
   providing an outer binder layer defining a third slit in the outer binder layer;
   laminating said another first substrate and the outer binder layer to the inner laminated structure to form a semi-finished FPCB wherein the outer binder layer is sandwiched between said another first substrate and the inner laminated structure, the first slit, the second slit and the third slit being aligned in a thicknesswise direction of the semi-finished FPCB, and in communication with the opening;

forming a conductive pattern in the conductive layer of said another first substrate;

defining a second slit in the conductive layer of said another first substrate along the partition line between the main portion and the excess portion thereof; and cutting the semi-finished FPCB along a peripheral boundary line of the excess portion of the another first substrate so as to remove the excess portion of said another first substrate, thus a portion of the second substrate being exposed to an exterior through the opening of the inner binder layer.

10. The method of claim 9, further comprising a step of defining a locating hole in the first substrates, all the binder layers and the second substrate.

11. The method of claim 9, wherein the first slit and the another first slit are formed using a laser.

12. The method of claim 11, wherein the laser is a carbon oxide laser.

13. The method of claim 9, wherein the second slits are formed using a laser.

14. The method of claim 13, wherein the laser is a Nd:YAG laser.

15. The method of claim 9, wherein the semi-finished FPCB is cut using a stamper or a laser.

* * * * *